US006806579B2

(12) United States Patent
Cowley et al.

(10) Patent No.: US 6,806,579 B2
(45) Date of Patent: Oct. 19, 2004

(54) ROBUST VIA STRUCTURE AND METHOD

(75) Inventors: Andy Cowley, Wappingers Falls, NY (US); Michael Stetter, Munich (DE); Erdem Kaltalioglu, Hsin-Chu (TW)

(73) Assignee: Infineon Technologies AG, Munich (DE)

(*) Notice: Subject to any disclaimer, the term of this patent is extended or adjusted under 35 U.S.C. 154(b) by 31 days.

(21) Appl. No.: 10/364,190

(22) Filed: Feb. 11, 2003

(65) Prior Publication Data

US 2004/0157442 A1 Aug. 12, 2004

(51) Int. Cl.[7] .............................................. H01L 21/44
(52) U.S. Cl. ..................... 257/762; 438/687; 438/648
(58) Field of Search ........................... 257/762, 306; 438/629, 63, 687, 766, 786, 761

(56) References Cited

U.S. PATENT DOCUMENTS

| | | | |
|---|---|---|---|
| 5,470,790 A | 11/1995 | Myers et al. | |
| 5,695,810 A | 12/1997 | Dubin et al. | |
| 6,124,216 A | * 9/2000 | Ko et al. | 438/766 |
| 6,159,851 A | 12/2000 | Chen et al. | |
| 6,218,283 B1 | 4/2001 | Park et al. | |
| 6,291,848 B1 | * 9/2001 | Chetlur et al. | 257/306 |
| 6,566,250 B1 | * 5/2003 | Tu et al. | 438/637 |
| 6,613,664 B2 | * 9/2003 | Barth et al. | 438/629 |

OTHER PUBLICATIONS

Wolf, Stanley, Ph.D. and Tauber, Richard N., Ph.D.; Silicon Processing for the VLSI Era, 2000; pp. 206–221 and pp. 474–475; vol. 1: Process Technology Second Edition; Lattice Press, Sunset Beach, California.

Wolf, Stanley, Ph.D. and Tauber, Richard N., Ph.D.; Silicon Processing for the VLSI Era, 2000; pp. 719–724; vol. 1: Process Technology Second Edition; Lattice Press, Sunset Beach, California.

* cited by examiner

*Primary Examiner*—David Nelms
*Assistant Examiner*—Thinh T Nguyen
(74) *Attorney, Agent, or Firm*—Slater&Matsil, L.L.P.

(57) ABSTRACT

A conductive line is formed in a first insulating layer. A second insulating layer is formed over the conductive line and the first insulating layer. A via extends through the second insulating layer to contact at least the top surface of the conductive line. The via also extends through the first insulating layer to contact at least a top portion of at least one sidewall of the conductive line. The conductive line sidewall may include an outwardly extending hook region, so that a portion of the via is disposed beneath the conductive line hook region, forming a locking region within the via proximate the conductive line hook region.

40 Claims, 4 Drawing Sheets

ROBUST VIA STRUCTURE AND METHOD

CROSS-REFERENCE TO RELATED APPLICATIONS

Embodiments of the present invention are related to U.S. patent application Ser. No. 09/751,552, entitled "Barbed Vias for Electrical and Mechanical Connection Between Conductive Layers in Semiconductor Devices," filed on Dec. 28, 2000, by Barth, et al., which is incorporated herein by reference.

TECHNICAL FIELD

Embodiments of the present invention relate generally to semiconductor devices, and more particularly to the formation of vias between conductive lines in neighboring metallization layers of multi-layer integrated circuits.

BACKGROUND

In the evolution of integrated circuits in semiconductor technology, there has been a trend towards device scaling. Scaling or reducing the size increases circuit performance, primarily by increasing circuit speed, and also increases the functional complexity of the integrated circuits. The number of devices per chip has increased throughout the years. When integrated circuits contained only a small number of devices per chip, the devices could be easily interconnected in a single level. However, the need to accommodate more devices and increased circuit speed has led to the use of multi-level or multi-layer interconnects.

In a multilevel interconnection system, the area needed by the interconnect lines is shared among two or more levels, which increases the active device fractional area, resulting in increased functional chip density. Implementing a multilevel interconnect process to a fabrication scheme increases the complexity of the manufacturing process. Typically, the active devices (e.g., the transistors, diodes, capacitors and other components) are manufactured in the lower layers of wafer processing, often referred to as the Front End Of the Line (FEOL). After the active devices are processed in the FEOL, the multilevel interconnects are usually formed in the processing timeframe often referred to as the Back End Of the Line (BEOL).

As semiconductor devices continue to shrink, various aspects of multilevel interconnect processes are being challenged. The propagation delay of integrated circuits becomes limited by the large RC time delay of interconnection lines when minimum features size is decreased below about 1 $\mu$m, for example. Therefore, the industry is tending towards the use of different materials and processes to improve multilevel interconnect implementations.

In the past, interconnect lines were typically made of aluminum. Now there is a trend towards the use of copper for interconnect lines because it is more conductive than aluminum. For many years, the insulating material used to isolate conductive lines from one another was silicon dioxide. Silicon dioxide has a dielectric constant (k) of approximately 4.0 or greater, where the dielectric constant value k is based on a scale where 1.0 represents the dielectric constant of a vacuum. However, now there is a move in the industry being made to the use of low-k dielectric materials (e.g., having a dielectric constant k of 3.6 or less) for the insulating material. The change in both the conductive material and insulating material used in multilevel interconnect schemes is proving challenging and requires a change in processing techniques.

Copper is a desirable conductive line material because it has a higher conductivity than aluminum. However, the RC (resistance/capacitance) time delay of copper conductive lines can be problematic, so low-k dielectric materials are used to reduce the capacitive coupling and reduce the RC time delay between interconnect lines. Some low-k insulating materials being used include organic spin-on materials, which must be heated to remove the liquid, or solvent. Often these low-k insulating materials have a high coefficient of thermal expansion (CTE) compared to metals such as copper. For example, some low-k dielectric materials have a CTE of in the order of 70 p.p.m./degrees C., compared to copper, which has a CTE of approximately 11 p.p.m./degrees C.

Semiconductor wafers are frequently temperature-cycled during fabrication due to the nature of the manufacturing process. When a device comprises a plurality of layers of metallization and dielectric materials, the solvent-removing heating step for the low-dielectric constant material layers must be repeated numerous times (e.g., each layer must be cured), which can be problematic. The mismatch of thermal expansion coefficients of metal conductive lines and low-k dielectric insulating layers results in the low-k dielectric insulating layer expanding more than the copper conductive lines. This CTE mismatch causes thermo-mechanical stress, leading to increased resistances, via delaminations, and electrical intermittencies and opens, particularly where vias contact underlying conductive lines, resulting in reduced yields.

SUMMARY OF THE INVENTION

Embodiments of the present invention achieve technical advantages as a via for connecting to an underlying conductive line and a method of forming the same that provides strength, robustness and stabile electrical resistance to metal interconnect layers of a multi-layer semiconductor device. The via is intentionally offset from an underlying conductive line. A portion of the insulating material proximate the top edge of the conductive line is removed, so that the via contacts a portion of the side of the conductive line, at the top edge. This increases the surface area so that there is a larger amount of surface area for the via to make contact with the conductive line, increasing the strength of the bond. In one embodiment, the conductive line includes an outwardly extending hook region, such that when the via is formed, a locking region is formed in the via proximate the conductive line hook region, further strengthening the structure.

In accordance with a preferred embodiment of the present invention, a method of manufacturing a semiconductor device includes providing a workpiece, disposing a first insulating layer over the workpiece, and patterning the first insulating layer with a conductive line pattern. The conductive line pattern is filled with conductive material to form at least one conductive line within the first insulating layer. The conductive line includes a top surface and at least one sidewall. A second insulating layer is disposed over the first insulating layer and the at least one conductive line. A portion of the second insulating layer is removed to expose at least a portion of the top surface of the conductive line. A portion of the first insulating layer is removed to expose at least a top portion of the at least one sidewall of the conductive line, wherein removing a portion of the second insulating layer and removing a portion of the first insulating layer comprise forming a via opening. The via opening is filled with conductive material to form a via, wherein the via makes contact with at least a portion of the top surface of the conductive line and at least a top portion of the at least one sidewall of the conductive line.

In accordance with another preferred embodiment of the present invention, a method of forming a via of a semiconductor device includes providing a workpiece, disposing a first insulating layer over the workpiece, and forming a hard mask over the first insulating layer. The hard mask and the first insulating layer are patterned, wherein patterned portions of the hard mask and the first insulating layer comprise sidewalls. A first conductive liner is formed over at least the sidewalls of the patterned hard mask and first insulating layer, and a first conductive material is formed over the first conductive liner, wherein a portion of the first conductive liner and a portion of the first conductive material comprise at least one conductive line. The conductive line includes a top surface and at least one sidewall, wherein the conductive line at least one sidewall comprises an outwardly extending hook region. A cap layer is formed over the first insulating layer and the first conductive liner, and a second insulating layer is disposed over the cap layer. A portion of the second insulating layer and a portion of the cap layer are removed to expose at least a portion of the top surface of the conductive line, and a portion of at least the hard mask is removed to expose at least a top portion of the at least one sidewall of the conductive line, wherein removing a portion of at least the hard mask and removing a portion of the first insulating layer comprise forming a via opening. A second conductive liner is formed over at least the second insulating layer, and a second conductive material is formed over the second conductive liner, wherein a portion of the second conductive liner and a portion of the second conductive material within the via opening form a via. The via makes contact with at least a portion of the top surface of the conductive line and at least a top portion of the at least one sidewall of the conductive line, and a portion of the via second conductive material is disposed beneath the conductive line hook region to form a locking region within the via proximate the conductive line hook region.

In accordance with yet another preferred embodiment of the present invention, a semiconductor device includes a workpiece, a first insulating layer disposed over the workpiece, and at least one conductive line formed within the first insulating layer, the conductive line having a top surface and at least one sidewall. The conductive line at least one sidewall includes an outwardly extending hook region. A second insulating layer is disposed over the conductive line and the first insulating layer, and at least one via is formed within the second insulating layer over the conductive line, wherein the via makes contact with at least a portion of the top surface of the conductive line and at least a top portion of the at least one sidewall of the conductive line.

Another preferred embodiment of the invention is a semiconductor device including a workpiece, a first insulating layer formed over the workpiece, and a hard mask formed over the first insulating layer. Portions of the first insulating layer and portions of the first hard mask comprise sidewalls. At least one conductive line is formed within the first insulating layer and the hard mask. The conductive line includes a liner disposed over at least the sidewalls of portions of the first insulating layer and portions of the hard mask. The conductive line also includes a fill material comprising copper disposed over the liner. The conductive line includes a top surface and at least one sidewall. A cap layer is disposed over at least the hard mask, and a second insulating layer comprised of a low-k dielectric material is formed over the cap layer. A via is formed extending through the second insulating layer and the cap layer to abut at least a portion of the top surface of the conductive line, wherein the via extends through at least the hard mask to abut at least a top portion of the at least one sidewall of the conductive line.

Advantages of embodiments of the present invention include preventing delamination, breakage and opens from occurring between vias and underlying conductive lines, during thermal expansion in multi-level interconnect structures, due to the various materials having different thermal expansion coefficients. Intentionally offsetting the via from an underlying conductive line results in increased surface area for the conductive line and via connection, improving the strength and robustness of the interconnect structure, especially during temperature cycling. The locking offset vias of the present invention provide a sturdy, robust, structure that can withstand the thermal cycling during the many times a wafer is exposed to high temperatures in order to cure low-dielectric constant insulating materials, and also during other processing steps. The invention results in improved yields and lowered electrical resistance value of vertical interconnect connections within the wafer.

The foregoing has outlined rather broadly the features and technical advantages of embodiments of the present invention in order that the detailed description of the invention that follows may be better understood. Additional features and advantages of embodiments of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that embodiments of the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely a semiconductor device having multilevel interconnect structures comprising copper. The invention may also be applied, however, to any multi-layer semiconductor device having multi-level interconnects, comprising other materials such as aluminum or other metals, and semiconductor materials such as polysilicon, as examples.

Problems with prior art via formation will be discussed, followed by a description of preferred embodiments of the present invention and some advantages thereof. The term "via" is used herein to describe a portion, e.g., a plug or line, of conductive material placed between conductive layers of a semiconductor integrated circuit (IC) to provide an electrical and mechanical path for current to flow during the operation of the IC. Only one via and conductive line is shown in each figure, although many vias and conductive lines may be present within each insulating layer. Only one interconnect level is shown: however, the top surface of the via may be connected to a subsequently-formed conductive line in an adjacent interconnect layer.

Figure 1:
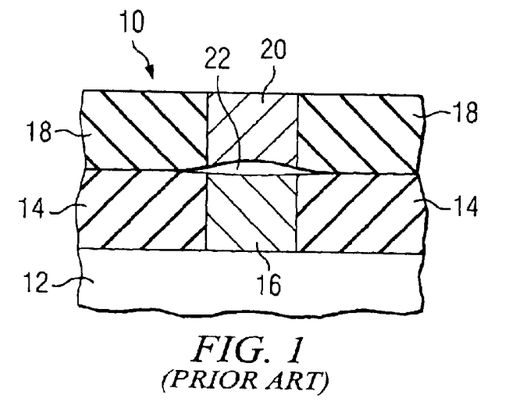
FIG. 1 illustrates a cross-sectional view of a prior art multi-level integrated circuit structure with a via providing a connection to an underlying conductive line of the various conductive layers.

FIG. 1 illustrates a cross-sectional view of a prior art multi-level integrated circuit structure 10 with a via 20 providing a connection to an underlying conductive line 16 in a conductive layer. To form the structure 10, a first insulating layer 14 is formed over a substrate or workpiece 12. The insulating layer 14 is patterned using lithography techniques, to form an opening for at least one conductive line 16. A conductive material is deposited over the insulating layer 14 to fill the conductive line opening. Excess conductive material is removed from the top surface of the insulating layer 14 to form a conductive line 16, in a single damascene process.

Damascene processes are typically used when the conductive line material comprises copper, for example. Alternatively, the conductive line 16 may be formed by depositing the conductive material over the substrate 12, patterning and etching away some of the conductive material to form the conductive line 16, and then depositing the first insulating layer 14 over the conductive line 16.

A second insulating layer 18 is deposited over the conductive line 16 and first insulating layer 14. A via 20 may be formed in the second insulating layer 18 in a damascene process, as described for the conductive line 16, or the via 20 may alternatively be formed by a deposition of conductive material, patterning and etching of the conductive material, followed by a deposition of the second insulating material 18, as example.

A problem arises in the via interconnect structure when there is a significant difference in the CTE of the via 20 material and the second insulating material 18. For example, if the second insulating material 18 has a higher CTE than the via 20 material, then when the device 10 is heated, the second insulating material 18 expands more than the via 20. This creates shear stress on the via 20, which can lead to the formation of a void 22 between the via 20 and conductive line 16, as shown. Alternatively, a partial void or hairline fractures (not shown) may be formed between the via 20 and conductive line 16.

This is particularly problematic when a low-k dielectric material is used for the second insulating layer 18 material, which materials typically have a much higher CTE than conductive materials, such as copper. For example, the coefficient of thermal expansion is 16–17 p.p.m./degrees C. for copper, compared with low-k dielectric material SILK™ which has a coefficient of thermal expansion of 60–70 p.p.m./degree C. The other insulating layers in the multilevel interconnect-stack, such as first insulating material 14, may also comprise low-k dielectric materials. In the process flow, after each low-dielectric constant material layer deposition, the organic spin-on material must be heated to remove the solvent. Thus, the lower level insulating layers, e.g. the ones first deposited, are heated may be heated six or more times to approximately, e.g., 400 degrees C. This thermal cycling causes a greater expansion of the low-k dielectric material 18 than the expansion of conductive via 20, causing a force to be exerted downwards and upwards from the via 20 towards lower conductive line 16 and any overlying conductive line (not shown).

Each time the wafer 10 is heated, the low-k dielectric material 14/18 expands more than the via 20 and conductive line 16 expand. The thermal mismatch between the via 20 and dielectric layer 18 causes an increase in the resistance of the conductive path created by conductive line 16 and via 20. In particular, the junction of the top surface of the conductive line 16 with the bottom surface of the via 20 is stressed due to the expansion of the dielectric layer 18, resulting in a partial or complete separation of the via from the top surface of the conductive line 16, which can cause an "open" condition in electrical connections, or intermittent electrical connections. The thermo-mechanical stress can also cause an increase in electrical resistance, and may result in decreased semiconductor device production yields or possibly failures during test or later on in use.

The prior art problems of via separation, reduced yields and increased resistance of conductive lines are reduced or alleviated by the use of embodiments of the present invention. FIGS. 2–5 show cross-sectional views of an integrated circuit structure in accordance with a preferred embodiment of the present invention at various stages of fabrication, wherein a via 139 (see FIG. 5) is intentionally offset from an underlying conductive line 117, and the insulating material 114 at a top sidewall of the conductive line is over-etched to increase the amount of surface area of the via to conductive line mechanical connection.

Figure 2:
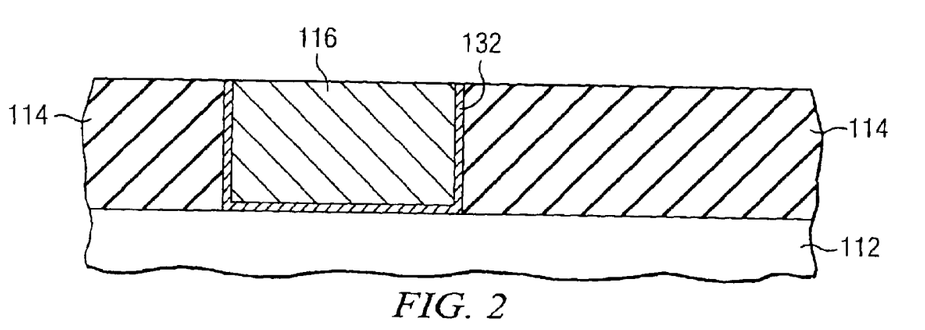
FIGS. 2–5 show cross-sectional views of an integrated circuit structure in accordance with a preferred embodiment of the present invention at various stages of fabrication, wherein a via is intentionally offset from an underlying conductive line, and the insulating material surrounding the conductive line is over-etched to increase the surface area of the via to conductive line mechanical connection.

Referring first to FIG. 2, a workpiece 112 is provided. The workpiece 112 preferably comprises silicon oxide disposed over, and possibly abutting, a single-crystal silicon substrate. The workpiece 112 may include other conductive layers or other semiconductor elements, e.g. transistors, diodes, etc. Compound semiconductors such as GaAs, InP, Si/Ge, SiC may alternatively be used in place of silicon.

A first insulating layer 114 is deposited over the workpiece 112. The first insulating layer 114 preferably comprises a low dielectric constant (k) dielectric material, having a dielectric constant k of 3.6 or less, for example. The first insulating layer 114 preferably comprises an organic spin-on material such as a polyimide. Trademarks for such materials include Dow Chemical Corporation's SiLK™ and AlliedSignal Inc.'s Flare™, as examples. Alternatively, a non-low-k dielectric material such as silicon dioxide and/or silicon nitride (e.g., $Si_3N_4$) may be used. If a low-k dielectric material is used, after spinning-on the material, the wafer may be exposed to a heating step of about 400 degrees C. to remove the solvents, for example.

The first insulating layer 114 is patterned and etched, and portions of the first insulating layer 114 are removed to create openings where a conductive line 116 will be formed. A first conductive material 116 is deposited over the first insulating layer 114 to fill the conductive line openings. Excess portions of the first conductive material 116 are removed from the top surface of the first insulating layer 114, e.g., using a chemical-mechanical polishing (CMP) process, forming at least one conductive line 117, as shown.

An optional first conductive liner 132 may be deposited prior to depositing the first conductive material 116. The first conductive liner 132 is preferably conformal, and may comprise a single layer of Ta, TaN, WN, TiN, as examples. The first conductive material 116 preferably comprise copper, although aluminum, other metals and combinations thereof may also be used. If the first conductive material 116 comprises copper, preferably a liner 132 is used, to prevent the copper from diffusing into the underlying workpiece 112 and first insulating layer 114 material. The first conductive liner may also comprise a bi-layer including a barrier layer and a seed layer. The barrier layer may comprise similar materials as listed for the single layer first conductive liner 132, above, as examples. The seed layer may comprise a copper alloy, for example, and may alternatively comprise other materials. The seed layer assists in the fill process of the first conductive material, particularly when a plating process is used to deposit the first conductive material, for example.

The first conductive line 117 is preferably formed by a damascene or dual damascene process, for example. The first conductive line 117 includes a top surface and at least one sidewall. The first conductive line 117 may comprise a long, thin rectangle, extending in and out of the paper, for example. The first conductive line 117 may comprise a high aspect ratio (not shown); e.g., the vertical height of the conductive line 117 may be greater than the horizontal width by 10:1 or greater. The first conductive line 117 includes the liner 132 and the first conductive material 116.

Figure 3:
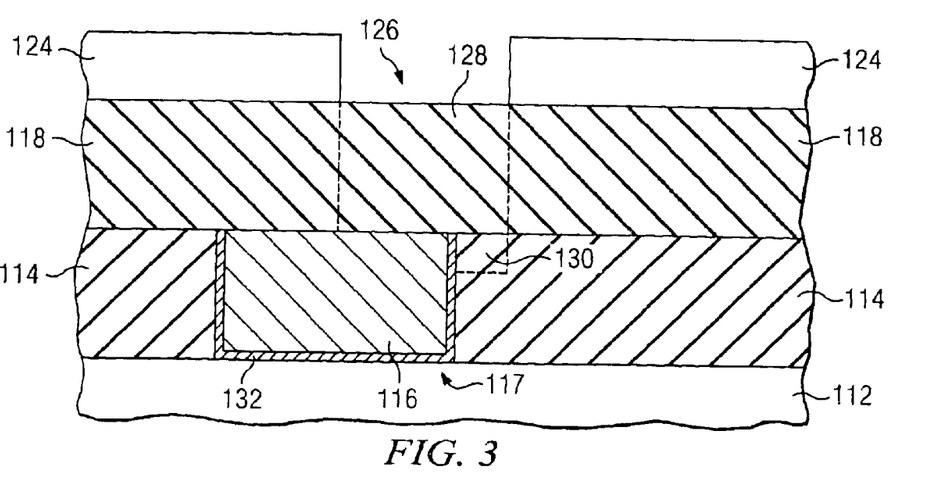

A second insulating layer 118 is deposited over the conductive line 117 and over the first insulating layer 114, as shown in FIG. 3. The second insulating layer 118 preferably comprises a low-k dielectric material having a dielectric constant of 3.6 or less, and may require heating, e.g., up to 400 degrees C. to remove solvents. Alternatively, the second insulating layer 118 may comprise conventional dielectric materials such as silicon dioxide and/or silicon nitride, for example.

The second insulating layer 118 is patterned via lithography, e.g., with a mask. As shown in FIG. 3, a photoresist 124 is deposited over the second insulating layer 118, and portions of the photoresist 124 are exposed. Portions of the photoresist 124 are removed, leaving a via pattern 126.

With the photoresist 124 left remaining on the second insulating layer 118, portions 128 of the second insulating layer 118 are removed to form via openings 134 (see FIG. 4) in the second insulating layer 118. The via openings 134 are preferably formed using a reactive ion etch (RIE) process step. The etch process step preferably comprises a predominantly anisotropic etch process in which the etchant material or gas is substantially directed towards the perpendicular surface of the wafer to create substantially vertical sidewalls within the second insulating layer 118. An anisotropic etch process preferably involves placing a photomask over the exposed second insulating layer 118 surface and exposing the wafer to an oxygen, nitrogen or combination thereof, or alternatively $CHF_3$ with a small amount of $O_2$, for example. All or part of the photoresist 124 may be removed as part of the etch process, in additional to removing a portion of the second insulating layer 118, for example.

In one embodiment, the etch process is stopped when the top surface of the underlying conductive line 117 is reached. In this embodiment, the wafer is exposed to a second etch process step to remove a portion 130 of the first insulating layer 114 proximate a top portion of the at least one sidewall of the conductive line 117, leaving the structure for a via opening 134 shown in FIG. 4. The second etch process may comprise a sputter etch that also cleans the via opening 134 prior to the depositing of the via forming conductive materials, as example. The second etch process is also predominantly anisotropic, but in one embodiment, the second etch process has enough of an isotropic component so as to remove a portion 252 of the first insulating layer 214 from beneath a hook region 254 of the conductive line 217 (not shown in FIG. 4; see FIGS. 7 and 8), for example.

Referring again to FIG. 4, in another embodiment, the etch process does not stop when the top surface of the underlying conductive line 117 is reached. Rather, the etch process is continued to remove a portion of the first insulating layer 114 proximate a top portion of the at least one sidewall of the conductive line 117, leaving the via opening 134 shown in FIG. 4. Again, this etch process is also predominantly anisotropic, but in one embodiment, the etch process has enough of an isotropic component so as to remove a portion 252 of the first insulating layer 214 from beneath a hook region 254 of the conductive line 217 (not shown in FIG. 4; see FIGS. 7 and 8), for example.

Figure 4:
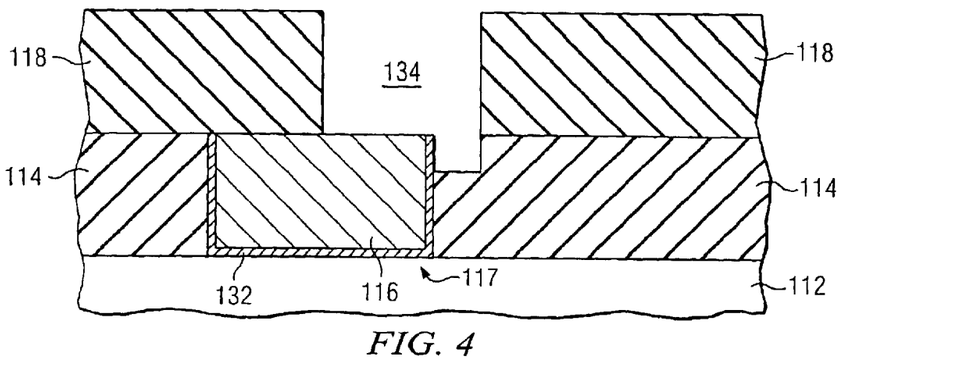

Preferably, removing a portion of the first insulating layer to form the via opening 134 comprises removing at least 100 Å from beneath the top surface of the first insulating layer. Also, preferably, removing a portion of the first insulating layer comprises removing 5 to 15% of the first insulating layer first thickness, from beneath the top surface of the first insulating layer. Preferably, in accordance with embodiments of the present invention, no part of the conductive line 117 material is removed during the etch process to remove portions of the first and second insulating layers 114 and 118.

Figure 5:
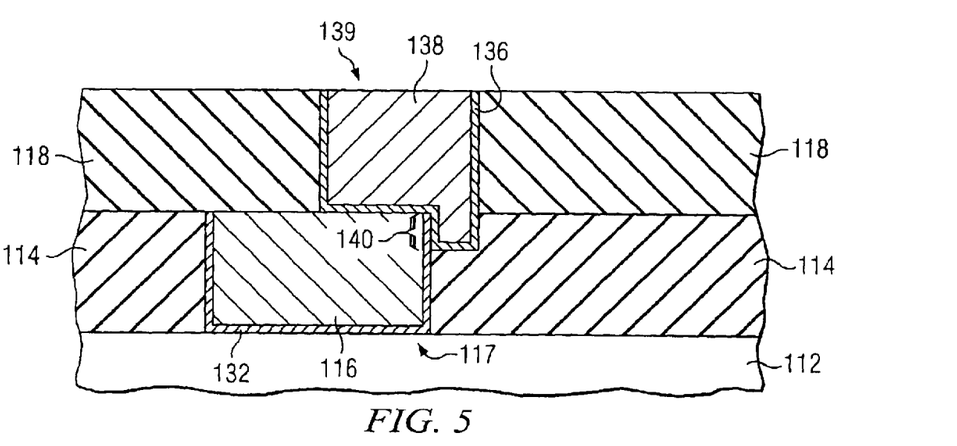

Next, the via opening 134 is filled with conductive material to form a via 139, as shown in FIG. 5. The via opening 134 may be filled first with an optional second conductive liner 136, and then the remainder of the via opening 134 is filled with a second conductive material 138 to form a via 139 which includes a liner 126 and fill material 138. The via 139 is adapted to make mechanical and electrical contact with and abut at least a portion of the top surface of the conductive line 117. The via 139 also makes mechanical and electrical contact with and abuts at least a top portion of the at least one sidewall of the conductive line 117, e.g. in region 140.

The via 139 preferably includes a second conductive liner 136 when the second conductive material 138 comprises copper, to prevent diffusion of the copper into the first and second insulating layer 118, for example. The optional second conductive liner 136 is preferably deposited using a conformal deposition process, leaving a conformal liner or diffusion barrier 136 along the interior walls of via opening 134. Preferably the conductive liner 132 comprises titanium nitride deposited by chemical vapor deposition (CVD). Alternatively, the conductive liner 132 may comprise tantalum nitride, tungsten nitride, a refractory metal or other barrier layers that may be conformally deposited, for example, using CVD processes or electro-less plating. The liner 132 may comprise a bi-layer of material, including, for example, a barrier layer and a conformal seed layer, which preferably comprises copper, aluminum, other metals or combinations thereof. The seed layer may be deposited using a CVD process, for example.

The remainder of the via opening 134 is filled with second conductive material 138, for example, using an electroplated or electro-less plating fill process to create a void-free via 139 having a portion residing within the second insulating layer 118 and a portion residing with the first insulating layer 114. The second conductive material 138 preferably comprises copper, aluminum or other metals or combinations thereof. The second conductive material 138 may be deposited using CVD or physical (non-conformal) vapor deposition (PVD), followed by a reflow process.

The via 139 is intentionally offset from at least one edge of the underlying conductive line 117. The offset permits the over-etching of the first insulating material 114 and creates via that hangs over the top edge of the conductive line (e.g., an overhang region), in accordance with embodiments of the invention. Preferably, the amount of horizontal offset (e.g., the amount the via 139 pattern is misaligned over the right-most edge of the conductive line 117, in FIG. 5) ranges from 10 to 35% of the width of the via 139, for example, and more preferably, the amount of horizontal offset is 10 to 25% of the width of the via.

In the embodiments of the present invention shown in FIGS. 2 through 5, the first insulating material 114 proximate the conductive line 117 is intentionally over-etched. Over-etching the first insulating material 114 results in an increased amount of surface area for the via 139 to contact and abut the conductive line 117. For example, in the cross-sectional view shown in FIG. 5, the surface area between the conductive line 117 and the via 139 is increased by amount 140, which is the length of the vertical portion of the via 139 that extends into the first insulating layer 114. The increased vertical surface area 140 increases the mechanical and electrical bonding area between the conductive line 117 and via 139, reducing the possibilities of via 139 and conductive line 117 separation and voids.

Note also that typically, the conductive line 117 comprises a long rectangular shape. Therefore, the additional vertical surface area 140 is multiplied by the length of the shorter of conductive line 117 and via 139 for the width of the via 139 (visualize the via width into and out of the paper), which may be cylindrical in shape, for example.

Figure 6:
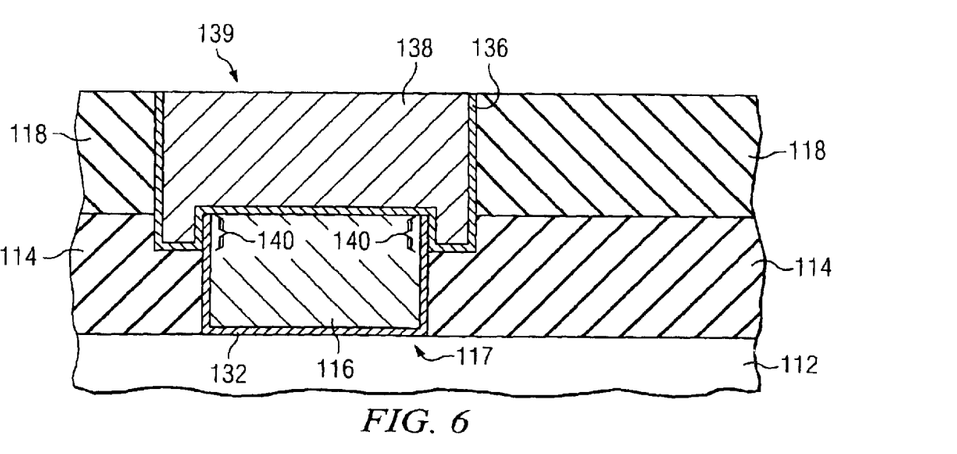
FIG. 6 shows an embodiment of the invention wherein the via width is greater than the width of the underlying conductive line, creating an offset on both sides of the conductive line.

The via 139 is shown having a horizontal width that is approximately the same as the horizontal width of the underlying conductive line 117. However, the via 139 width may be smaller than the conductive line 117 width, or alternatively, the via 139 width may be larger than the conductive line 117. If the via 139 width is larger than the conductive line 117 width, then the via 139 may extend down into the first insulating layer 114 on both sides proximate the top region of opposing sidewalls of the conductive line 117, creating an even larger increase in surface area, e.g., at regions 140, for the mechanical and electrical bonding of the via 139 to the conductive line 117, as shown in FIG. 6.

The conductive material used to filling the via opening may comprise a material having a first coefficient of thermal expansion (CTE). The first CTE may comprise 20 p.p.m./degrees C. or less, for example. The second insulating layer may comprise a material having a second CTE, the second CTE being higher than the first CTE. The second CTE may be 50 p.p.m./degrees C. or greater, for example. The other insulating layers of the multilevel interconnect structure, such as the first insulating layer 114, may also comprise the second CTE material. Similarly, the other conductive layers of the multilevel interconnect structure, such as the conductive line 117, may also comprise the first CTE material.

A third dielectric layer, preferably comprising a low-k dielectric layer, may be deposited over the via 139 and over the top surface of the second insulating layer 118 (not shown). The third dielectric layer may be heated to remove the solvents, and then patterned with a conductive line pattern to contact the via 130. Alternatively, a non-low-k dielectric such as silicon dioxide and/or silicon nitride may be used for the third dielectric layer. A second conductive line or region may be then formed within the third dielectric layer and over the via 139, wherein the via 139 is used to connect to the overlying second conductive line to conductive line 117 in the underlying first insulating layer 114. An optional conductive liner may be deposited prior to the formation of the second conductive line. The overlying second conductive line within the third insulating layer preferably comprises a metal material the same as the first conductive line 117, such as copper, aluminum or a combination thereof, for example. Many, e.g., six to eight more, other conductive layers with a via 139 that is intentionally offset from and over-hanging the underlying conductive line, with the underlying insulating layer being over-etched, may be deposited in this manner in accordance with the present invention, to produce a more robust multilevel interconnect structure.

Figure 7:
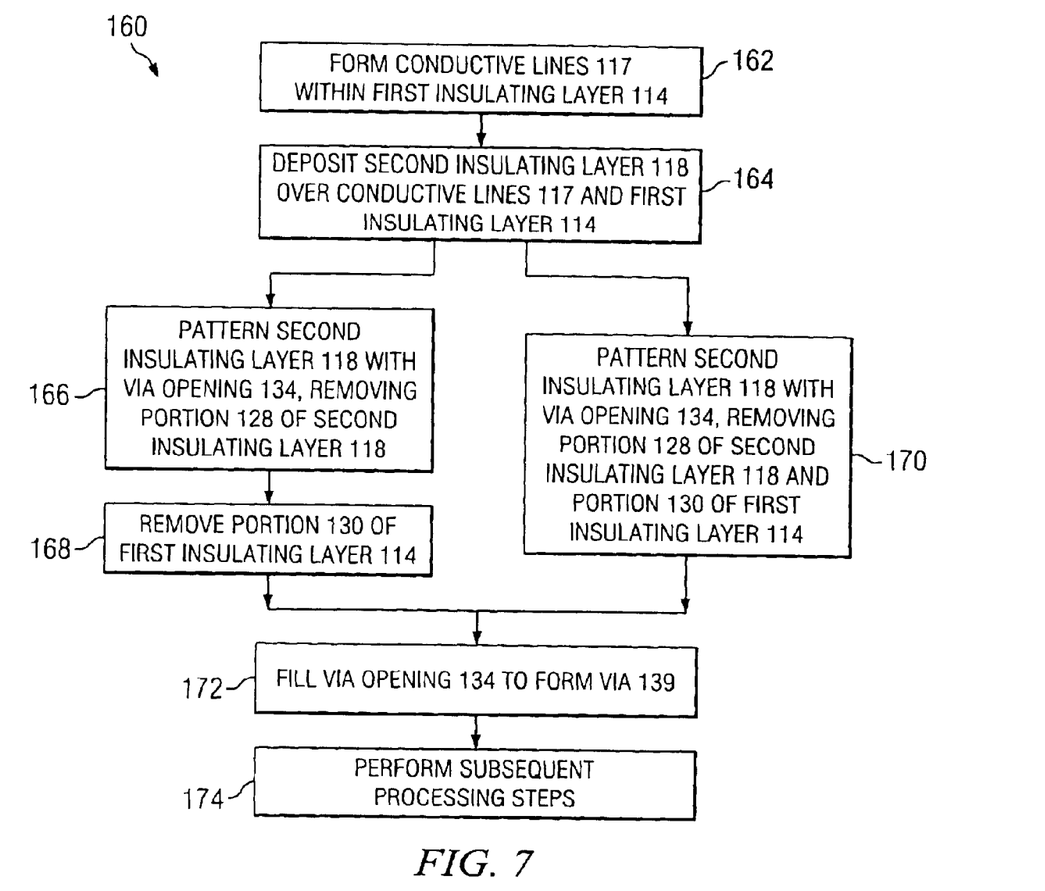
FIG. 7 demonstrates a flow chart for a preferred method of fabricating the via in accordance with embodiments of the present invention.

A flow chart 160 for forming a robust via 139 in accordance with embodiments of the invention is shown in FIG. 7. First, a conductive line 117 are formed within first insulating layer 114 (step 162), and a second insulating layer 118 is deposited over the conductive line 117 and the first insulating layer 114 (step 164). Next, in one embodiment, a two-step etch process is used to form the via opening 134. In this embodiment, the second insulating layer 118 is patterned with via opening 134, removing a portion 128 of the second insulating layer 118 (step 166). Then, a portion 130 of the first insulating layer 114 is removed (step 168). In another embodiment, a single etch process is used to form the via opening 134 in both the second and first insulating materials 118 and 114. The second insulating layer 118 is patterned with via opening 134, removing portion 128 of second insulating layer 118 and portion 130 of first insulating layer 114 (step 170). The via opening 134 is then filled with conductive material to form a via 139 (step 172) as shown in FIG. 5, and subsequent processing steps are then performed on the wafer (step 174).

Figure 8:
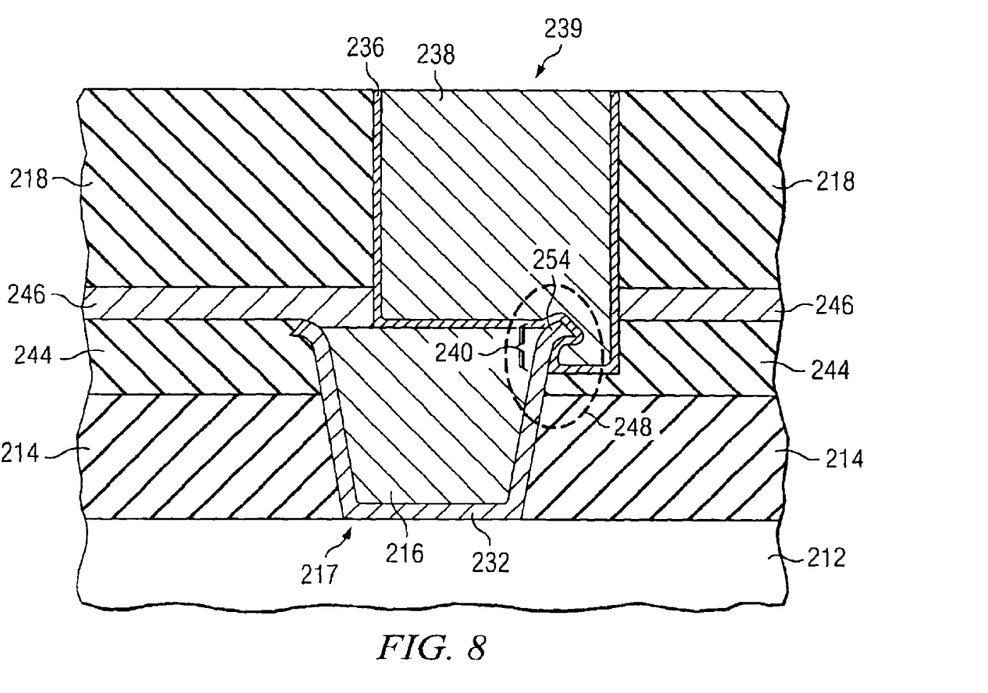
FIG. 8 shows a cross-sectional view of an embodiment of the invention, wherein the conductive line includes a hook region extending outwardly towards the over-etched region of the insulating layer surrounding the conductive line, resulting in the formation of a locking or keyed region of the via to the conductive line.

FIG. 8 shows a cross-sectional view of another preferred embodiment of the invention, wherein the conductive line 217 includes a hook region 254 extending outwardly towards the over-etched region of the insulating layer 244 surrounding the conductive line, resulting in the formation of a keyed region 248 of the via 239 to the conductive line 217. The structure is preferably formed using similar manufacturing steps and materials as described for the embodiments shown in FIGS. 2–5, for example. However, in FIG. 8, an optional hard mask 244 insulating layer and cap layer 246 are shown.

Preferably, the first insulating layer 214 and second insulating layer 218 comprise low-k dielectric materials such as an organic inter-level dielectric (ILD) material or those described for the FIGS. 2–5. The hard mask 244 is deposited over the first insulating layer 214 prior to the formation of the opening for the conductive line 217. The hard mask 244 comprises a dielectric material such as silicon nitride or silicon dioxide, as examples.

The conductive line 217 includes sidewalls that are slightly tapered inwardly towards the bottom of the conductive line pattern, resulting in a hook region 254 at the outer top portion of the conductive line 217 sidewall, as shown. The hook region extends outwardly away from the conductive line 217, towards the hard mask 244 or the first insulating layer 214.

The conductive line 217, especially when comprising copper, preferably comprises a first conductive liner 232 and a first conductive fill material 216. The first conductive liner 232 may comprise a bi-layer of a barrier layer and a seed layer, for example, as described for the embodiments shown in FIGS. 2–5.

After forming the conductive line 217, an optional dielectric cap layer 246 preferably comprising SiN, and alternately comprising the trademark name BloK™ or other dielectric diffusion barriers, may be deposited over the conductive line 217 and the hard mask 244 (or over the first insulating layer 214, when a hard mask 244 is not used). The dielectric cap layer 246 may not be required when the conductive line 217 comprises aluminum, for example, but preferably a cap layer 246 is used when the conductive line 217 comprises copper.

The second insulating layer 218 is deposited over the cap layer 246, and then the via opening (not shown in FIG. 8; refer to FIG. 4) is formed in the second insulating layer 218, cap layer 246, and hard mask 244. 28. Preferably, the via extends below the top surface of the hard mask by at least 100 Å. Also, preferably, the via extends below the top surface of the hard mask by approximately 20–40% of the hard mask first thickness. Alternatively, the via opening may also extend through the optional hard mask 244 into the first insulating layer 214, not shown. If no hard mask 244 is used, then preferably, removing a portion of the first insulating layer 214 to form the via opening 234 comprises removing at least 100 Å from beneath the top surface of the first insulating layer 214. Also, preferably, removing a portion of the first insulating layer 214 comprises removing 5 to 15% of the first insulating layer 214 first thickness from beneath the top surface of the first insulating layer 214. A second conductive liner 236 and second conductive material 238 are deposited within the via opening to form a via 239, as shown.

As in the embodiment shown and described with reference to FIGS. 2–5, again, the via 239 is preferably intentionally offset in the horizontal direction from the conductive line 217 so that insulating material proximate the top portion of the conductive line 217 sidewall, in this case, at least the hard mask 244, may be over-etched. The etch process that removes at least the hard mask 244 is preferably at least partially isotropic in this embodiment to ensure that a portion of the hard mask 244 material will be removed from beneath the conductive line hook region 254. The via 239 may also be intentionally over-sized to create an overhang on the sidewall opposing sidewall 217 in addition to the overhang abutting sidewall 217 (not shown in FIG. 8; see FIG. 6).

Figure 9:
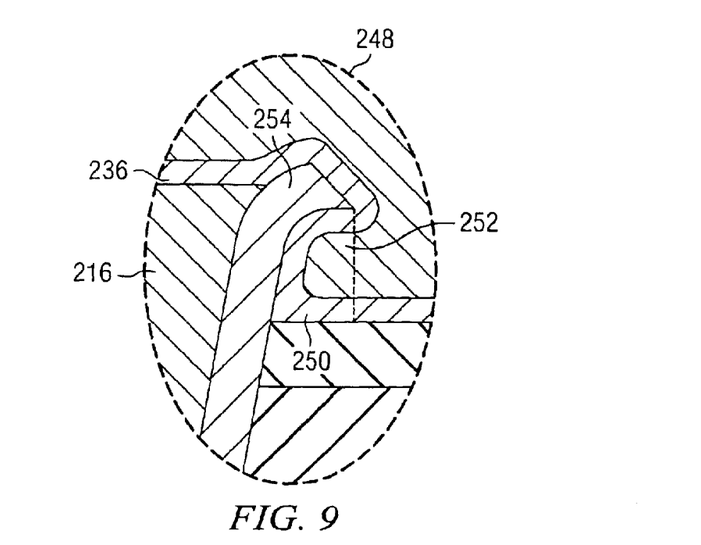
FIG. 9 shows an enlarged view of the hook region of the conductive line, and the locking region of the via that is formed beneath the hook region.

FIG. 9 shows an enlarged view of the keyed region 248 that includes the hook region 254 of the conductive line 217, and the locking region 252 of the via 239 that is formed beneath the conductive line hook region 254. Advantageously, a locking region 252 is formed proximate, adjacent to and underlying the hook region 254 of the conductive line 217, creating a mechanically keyed region that is robust. In this keyed region 248, advantageously, the conductive line hook region 254 and via locking region 252 are mechanically locked together, so that thermal stresses impacting the structure will not cause the conductive line 217 and via 239 to separate. The hook region 254 fits into the locking region 252, so that the via 239 cannot move. The via 239 is stabilized with respect to the conductive line 217, regardless of the expansion or contraction of the surrounding insulating materials 218, 246, 244 and/or 214.

Note that although the via locking portion 252 is shown in FIGS. 8 and 9 as being formed within the hard mask 244, the locking portion 252 may alternatively also extend down into the first insulating layer 214. Furthermore, the locking portion 252 may be contained entirely within the first insulating layer 214, when a hard mask 244 is not used.

Embodiments of the present invention achieve technical advantages as a via interconnect structure and method of fabrication thereof for connecting conductive layers of a multi-layer integrated circuit that provides improved mechanical strength. The via 139/239 structure and method of forming described herein prevents delamination, separation, breakage and opens from occurring between vias 139/239 and underlying conductive lines 117/217 during thermal expansion: during the multiple times the wafer is exposed to extreme heat during removal of low-dielectric constant insulating material solvents, layer deposition, final anneal, or dielectric cure, as examples. The use of the present via 139/239 structure and method of forming the same results in improved yields and lowered electrical resistance value of vertical connections within the wafer. The undercut portion of the via 139/239 that extends into the first insulating layer 114/214/244 provides a larger surface area 140/240 for a via 139/239 to mechanically and electrically connect to underlying conductive line, stabilizing the thermal expansion effects. The hook region 254 of the conductive line 217 results in the formation of a locking region 252 of the via 239, forming a keyed region 248. The invention also results in improved electrical reliability of the vertical chain of conductive lines 117/217 and vias 139/239.

Embodiments of the invention are described herein for single damascene structures; however, has application in dual damascene applications, as well.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and current sensing architectures described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:
providing a workpiece;
disposing a first insulating layer over the workpiece;
patterning the first insulating layer with a conductive line pattern;
filling the conductive line pattern with conductive material to form at least one conductive line within the first insulating layer, the conductive line including a top surface and at least one sidewall with an outside surface;
disposing a second insulating layer over the first insulating layer and the at least one conductive line;
removing a portion of the second insulating layer to expose at least a portion of the top surface of the conductive line;
removing a portion of the first insulating layer to expose at least a top portion of said outside surface of the at least one sidewall of the conductive line, wherein removing a portion of the second insulating layer and removing a portion of the first insulating layer forms a via opening wholly within the insulating layers; and
filling the via opening with conductive material to form a via, wherein the via makes contact with at least a portion of the top surface of the conductive line and at least a top portion of said outside surface of the at least one sidewall of the conductive line.

2. The method according to claim 1, wherein the conductive line at least one sidewall comprises an outwardly extending hook region, wherein filling the via opening with conductive material includes disposing the conductive material beneath the conductive line hook region, forming a locking region within the via proximate the conductive line hook region.

3. The method according to claim 1, wherein removing a portion of the first insulating layer and forming a via opening comprise a single etch step.

4. The method according to claim 3, wherein the etch step comprises a reactive ion etch (RIE).

5. The method according to claim 1, further comprising a sputter etch prior to filling the via opening.

6. The method according to claim 5, wherein the sputter etch comprises removing the portion of the first insulating layer.

7. The method according to claim 1, wherein removing a portion of the first insulating layer comprises removing at least 100 Å of the first insulating layer.

8. The method according to claim 1, wherein the first insulating layer comprises a first thickness, removing a portion of the first insulating layer comprises removing 5 to 15% of the first insulating layer first thickness.

9. The method according to claim 1, wherein filling the via opening with conductive material comprises filling the via opening with a material having a first coefficient of thermal expansion (CTE), wherein disposing a second insulating layer comprises depositing a material having a second CTE, the second CTE being higher than the first CTE.

10. The method according to claim 9, wherein the first CTE is 20 p.p.m/degrees C. or less, wherein the second CTE is 50 p.p.m/degrees C. or greater.

11. The method according to claim 9, wherein the first insulating layer comprises the second CTE material.

12. The method according to claim 1, wherein forming a second insulating layer comprises depositing a low-dielectric constant material having a dielectric constant of 3.6 or less, wherein the conductive line material comprises copper or aluminum.

13. The method according to claim 1, wherein forming at least one conductive line comprises patterning the first insulating layer with an opening for the at least one conductive line, depositing a fist conductive liner over the insulating layer, wherein the first conductive liner lines the opening including the sidewalls, and filling the opening over the first conductive liner with a first conductive fill material such that said via makes contact with the first conductive liner of said ton portion of the at least one sidewall of the conductive line; and wherein filling the via opening comprises depositing a second conductive liner over the via opening, and filling the via opening over the second conductive liner with a second conductive fill material.

14. The method according to claim 13, wherein the first conductive fill material or the second conductive fill material are filled by plating.

15. The method according to claim 1 wherein forming a via opening comprises exposing the dielectric layer to an anisotropic etch.

16. A method of forming a via of a semiconductor device, comprising:
providing a workpiece;
disposing a first insulating layer over the workpiece;
forming a hard mask over the first insulating layer;
patterning the hard mask and the first insulating layer, wherein patterned portions of the hard and the first insulating layer comprise sidewalls;
forming a first conductive liner over at least the sidewalls of the patterned hard mask and first insulating layer to define an outside surface;
forming a first conductive material over the first conductive liner, wherein a portion of the first conductive liner and a portion of the first conductive material comprise at least one conductive line, the conductive line including a top surface and at least one sidewall, wherein the conductive line at least one sidewall comprises an outwardly extending hook region;
forming a cap layer over the first insulating layer and the first conductive liner;
disposing a second insulating layer over the cap layer;
removing a portion of the second insulating layer and a portion of the cap layer to expose at least a portion of the top surface of the conductive line;
removing a portion of at least the hard mask to expose at least a top portion of said defined outside surface of the conductive liner covering the hard mask on the at least one sidewall of the conductive line, wherein removing a portion of at least the hard mask and removing a portion of the first insulating layer forms a via opening wholly within the hard mask and first insulating layer;
forming a second conductive liner over at least the second insulating layer; and
forming a second conductive material over the second conductive liner, wherein a portion of the second conductive liner and a portion of the second conductive material within the via opening form a via, wherein the via makes contact with at least a portion of the top surface of the conductive line and at least a top portion of the at least one sidewall of the conductive line, and wherein a portion of the via second conductive material is disposed beneath the conductive line hook region to form a locking region within the via proximate the conductive line hook region.

17. A method of manufacturing a semiconductor device, the method comprising:

provinding a workpiece;

forming a first insulating layer over the workpiece;

forming at least one conductive line within the first insulating layer, the conductive line having a top surface and at least one sidewall defining an outside surface, wherein the conductive line at least one sidewall comprises an outwardly extending hook region;

forming a second insulating layer over the conductive line and the first insulating layer; and forming at least one via within the second insulating layer over the conductive line, wherein the at least one via makes contact with at least a portion of the top surface of the conductive line and at least a top portion of said defined outside surface of said at least one sidewall of the conductive line.

18. The method according to claim 17, wherein forming the at least one via comprises disposing a portion of the at least one via beneath the conductive line hook region, forming a locking region within the at least one via proximate the conductive line hook region.

19. The method according to claim 17, wherein the first insulating layer has a top surface, wherein forming the at least one via comprises forming at least one via that extends below the top surface of the first insulating layer by at least 100 Å.

20. The method according to claim 17, wherein the first insulating layer comprises a first thickness and has a top surface, wherein forming the at least one via comprises forming at least one via that extends below the top surface of the first insulating layer by approximately 5 to 15% of the first insulating layer first thickness.

21. The method according to claim 17, wherein forming the at least one via comprises forming the at least one via comprising a material having a first coefficient of thermal expansion (CTE), and wherein forming the second insulating layer comprises forming a material having a second CTE, the second CTE being higher than the first CTE.

22. The method according to claim 21, wherein the first CTE is 20 p.p.m/degrees C. or less, wherein the second CTE is 50 p.p.m/degrees C. or greater.

23. The method according to claim 21, wherein the first insulating layer comprises the second CTE material.

24. The method according to claim 17, wherein forming the second insulating layer comprises forming a low-dielectric constant material having a dielectric constant of 3.6 or less, wherein forming the at least one conductive line comprises forming the at least one conductive line from copper or aluminum.

25. The method according to claim 17, wherein forming the at least one conductive line comprises forming a first conductive liner within the first insulating layer and disposing a first conductive fill material over the first conductive liner, and forming the at least one via comprises forming a second conductive liner within the second insulating layer and disposing a second conductive fill material over the second conductive liner.

26. The method according to claim 17, wherein the at least one conductive line comprises a second sidewall, and wherein forming the at least one via comprises forming at least one via that makes contact with at least a top portion of the second sidewall of the conductive line.

27. A method of manufacturing a semiconductor device, the method comprising:

providing a workpiece;

forming a first insulting layer over the workpiece;

forming a hard mask over the first insulating layer, wherein portions of the first insulating layer and portions of the hard mask comprise sidewalls;

forming a conductive line within the first insulating layer and the hard mask, the conductive line including a liner disposed over at least the sidewalls of portions of the first insulating layer and portions of the hard mask and defining an outside surface, the conductive line including a fill material disposed over the liner, the fill material comprising copper, the conductive line having a top surface and at least one sidewall;

disposing a cap layer over at least the hard mask;

forming a second insulating layer over the cap layer, the second insulating layer comprising a low-k dielectric material; and forming a via extending through the second insulating layer and the cap layer to abut at least a portion of the top surface of the conductive line, wherein the via extends through at least the hard mask to abut at least a top portion of the said defined outside surface of the liner disposed over at least one sidewall of the conductive line.

28. The method according to claim 27, wherein forming the conductive line comprises forming a conductive line having at least one sidewall comprising an outwardly extending hook region, wherein a portion of the via is disposed beneath the conductive line hook region, forming a locking region within the via proximate the conductive line hook region.

29. The method according to claim 27, wherein the hard mask has a top surface, wherein forming the via comprises forming a via extending below the top surface of the hard mask by at least 100 Å.

30. The method according to claim 27, wherein the hard mask comprises a first thickness and has a top surface, wherein forming the via comprises forming a via extending below the top surface of the hard mask by approximately 20–40% of the hard mask first thickness.

31. The method according to claim 27, wherein forming the via comprises forming a via comprising a material having a first coefficient of thermal expansion (CTE), wherein forming the second insulating layer comprises forming a material having a second CTE, the second CE being higher than the first CTE.

32. The method according to claim 31, wherein the first CTE is 20 p.p.m/degrees C. or less, wherein the second CTE is 50 p.p.m/degrees C. or greater.

33. The method according to claim 31, wherein the first insulating layer comprises the second CTE material.

34. The method according to claim 27, wherein forming the second insulating layer comprises forming a second insulating layer having a dielectric constant of 3.6 or less.

35. The method according to claim 27, wherein forming the via comprises forming a second conductive liner within the second insulating layer, and disposing a second conductive fill material over the second conductive liner.

36. The method according to claim 27, wherein the conductive line comprises a second sidewall, and wherein forming the via comprises forming a via that makes contact with at least a top portion of the second sidewall of the conductive line.

37. The method according to claim 1 wherein said step of removing a portion of the first insulating layer further comprises removing said portion of the first insulating layer so that the conductive line material is not removed.

38. A method of manufacturing a semiconductor device, comprising:

provi­ding a workpiece;

disposing a first insulating layer over the workpiece;

patterning the first insulating layer with a conductive line pattern;

filling the conductive line pattern with conductive material to form at least one conductive line within the first insulating layer, the conductive line including a top surface and at least one sidewall;

disposing a second insulating layer over the first insulating layer and the at least one conductive line;

removing a portion of the second insulating layer to expose at least a portion of the top surface of the conductive line;

removing a portion of the first insulating layer to expose at least a top portion of the at least one sidewall of the conductive line and such that the conductive line material is not removed, wherein removing a portion of the second insulating layer and removing a portion of the first insulating layer comprise forming a via opening; and filling the via opening with conductive material to form a via, wherein the via makes contact with at least a portion of the top surface of the conductive line and at least a top portion of the at least one sidewall of the conductive line.

39. The method according to claim 17, wherein said step of forming one via within the second insulating layers further comprise forming said via such that material is not removed from said at least one sidewall of said conductive line.

40. A method of manufacturing a semiconductor device, the method comprising:

providing a workpiece;

forming a first insulating layer over the workpiece;

forming at least one conductive line within the first insulating layer, the conductive line having a top surface and at least one sidewall, wherein the conductive line at least one sidewall comprises an outwardly extending hook region;

forming a second insulating layer over the conductive line and the first insulating layer; and forming at least one via within the second insulating layer over the conductive line and within the first insulating layer such that material is not removed from said at least one sidewall of said conductive line, wherein the at least one via makes contact with at least a portion of the top surface of the conductive line and at least a top portion of the at least one sidewall of the conductive line.

* * * * *

UNITED STATES PATENT AND TRADEMARK OFFICE
CERTIFICATE OF CORRECTION

PATENT NO. : 6,806,579 B2
DATED : October 19, 2004
INVENTOR(S) : Cowley et al.

It is certified that error appears in the above-identified patent and that said Letters Patent is hereby corrected as shown below:

Column 14,
Line 16, delete "ton" and insert -- top --.

Column 16,
Line 49, delete "CE" and insert -- CTE --.

Signed and Sealed this

Fifteenth Day of February, 2005

JON W. DUDAS
*Director of the United States Patent and Trademark Office*